(12) United States Patent
Nagano et al.

(10) Patent No.: US 6,956,265 B2
(45) Date of Patent: Oct. 18, 2005

(54) SEMICONDUCTOR DEVICE AND METHOD FOR MANUFACTURING PARTIAL SOI SUBSTRATES

(75) Inventors: Hajime Nagano, Yokohama (JP); Ichiro Mizushima, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 89 days.

(21) Appl. No.: 10/675,950

(22) Filed: Oct. 2, 2003

(65) Prior Publication Data

US 2005/0023609 A1 Feb. 3, 2005

(30) Foreign Application Priority Data

Jul. 31, 2003 (JP) ........................................ 2003-283479

(51) Int. Cl.⁷ .............................................. H01L 27/01
(52) U.S. Cl. ...................... 257/347; 438/197; 257/350; 257/351
(58) Field of Search ........................................ 257/347

(56) References Cited

U.S. PATENT DOCUMENTS

| | | | | |
|---|---|---|---|---|
| 5,399,507 A | * | 3/1995 | Sun | 438/152 |
| 6,063,652 A | * | 5/2000 | Kim | 438/155 |
| 6,531,754 B1 | * | 3/2003 | Nagano et al. | 257/510 |
| 6,835,981 B2 | * | 12/2004 | Yamada et al. | 257/347 |

FOREIGN PATENT DOCUMENTS

JP        11-150182        6/1999

* cited by examiner

Primary Examiner—Thao P. Le
(74) Attorney, Agent, or Firm—Finnegan, Henderson, Farabow, Garrett & Dunner, L.L.P.

(57) ABSTRACT

There is closed a semiconductor device which comprises a semiconductor substrate including an SOI region where a first insulating film is buried, and a non-SOI region, the semiconductor substrate being provided with a boundary region formed between the SOI region and the non-SOI region and having a second insulating film buried therein, the second insulating film being inclined upward from the SOI region side toward the non-SOI region side, the second insulating film having a thickness smaller than the thickness of the first insulating film and being tapered from the SOI region side to the non-SOI region side, a pair of element isolating insulating regions separately formed in the non-SOI region of semiconductor substrate and defining element regions, a pair of impurity diffusion regions formed in the element regions, and a gate electrode formed via a gate insulating film in the element region of the semiconductor substrate.

7 Claims, 4 Drawing Sheets

SEMICONDUCTOR DEVICE AND METHOD FOR MANUFACTURING PARTIAL SOI SUBSTRATES

CROSS-REFERENCE TO RELATED APPLICATIONS

This application is based upon and claims the benefit of priority from the prior Japanese Patent Application No. 2003-283479, filed Jul. 31, 2003, the entire contents of which are incorporated herein by reference.

BACKGROUND OF THE INVENTION

1. Field of the Invention

This invention relates to a semiconductor device and a method for manufacturing a partial SOI (silicon on insulator) substrate.

2. Description of the Related Art

Since the DRAM provided with memory cells each comprising one MOSFET and one capacitor is suited for high integration, the DRAM is employed in various products as a low cost memory of large capacity. In recent years in particular, there is an increasing demand for the development of a system LSI wherein logic and the DRAM are integrated in the same semiconductor chip to enhance the system performance. On the other hand, the SOI MOSFET where the semiconductor elements thereof are disposed not on the conventional silicon substrate but on a thin film SOI substrate is now highlighted in the art as it is capable of enhancing the performance of a logic circuit which is mainly constituted by MOSFET, and the application of this SOI MOSFET to products with high performance logic has already been started. Under this trend, it is now urgently needed to develop a system LSI where the DRAM is mixedly mounted on a high performance logic chip based on the SOI.

However, since the SOI MOSFET is constructed such that in the ordinary employment thereof, the electric potential of the body region where channel is to be formed floats, the following problems are caused. Namely, due to so-called substrate-floating effects, leak current or fluctuations of characteristics including fluctuations of threshold value are caused to generate in concomitant with the operation of circuit. Therefore, the SOI MOSFET has been considered unsuitable for use in a circuit where the level of leak current, the scattering of threshold value, noise, etc. are required to be severely controlled, for example for use in the cell transistor of DRAM or the circuit of sense amplifier. If the problems of the substrate-floating is to be fundamentally solved, it is required to provide the MOSFET with a leader element region drawn out of the body portion and with a contact to control the potential of the body region. In this case however, there is a problem that the area of cells as well as the area of sense amplifier portion are caused to increase considerably, so that the most important characteristics of DRAM, i.e. the capability thereof to realize high integration would be deteriorated.

With a view to overcoming the aforementioned problems, there have been proposed various methods, each of which is mainly featured in that a non-SOI region is allocated to the surface of an SOI substrate (partial SOI), so that a circuit portion which is incompatible with the effects of substrate-floating is enabled to be formed in the non-SOI region. One of the methods is shown in FIGS. 1A to 1C, which is featured in that oxygen ions are implanted into only a portion of a silicon substrate, which is then heat-treated to form a partially buried oxide film. Specifically, first of all, as shown in FIG. 1A, a thermal oxide film mask 2 is formed on a predetermined region of the surface of the silicon substrate 1. Then, as shown in FIG. 1B, oxygen ion 3 is implanted through the thermal oxide film mask 2 into the silicon substrate 1. Thereafter, the resultant silicon substrate 1 is subjected to heat treatment to form a buried oxide film 4 in the SOI region "B" of the silicon substrate 1 as shown in FIG. 1C.

However, the aforementioned method is accompanied with several problems as shown in FIG. 1C. Since there is a difference in thermal expansion coefficient between the buried oxide film 4 and the silicon substrate 1, crystal defects 12 are caused to generate in the non-SOI region "A" due to the expansion of the buried oxide film 4. Therefore, the quality of the non-SOI region "A" is not sufficiently high enough to enable a semiconductor element to be formed therein. Further, a step portion 11 is caused to generate at a boundary portion between the SOI region "B" and the non-SOI region "A", thus necessitating an additional process to eliminate this step portion 11 to flatten the surface of the silicon substrate 1.

BRIEF SUMMARY OF THE INVENTION

A semiconductor device according to one embodiment of the present invention comprises:

a semiconductor substrate including an SOI region where a first insulating film is buried, and a non-SOI region, the semiconductor substrate being provided with a boundary region formed between the SOI region and the non-SOI region and having a second insulating film buried therein, the second insulating film being inclined upward from the SOI region side toward the non-SOI region side, the second insulating film having a thickness which is smaller than the thickness of the first insulating film and being tapered from the SOI region side to the non-SOI region side;

a pair of element isolating insulating regions separately formed in the non-SOI region of semiconductor substrate and defining element regions;

a pair of impurity diffusion regions formed in the element regions and in contact with the element isolating insulating regions, respectively; and a gate electrode formed via a gate insulating film in the element region of the semiconductor substrate.

A method for manufacturing a partial SOI substrate according to one embodiment of the present invention comprises:

forming a mask on a predetermined region of a semiconductor substrate;

isotropically etching a surface of exposed region of the semiconductor substrate to form a recessed portion and to permit an edge portion of the mask to overhang over the semiconductor substrate;

implanting oxygen ions into the semiconductor substrate;

heat-treating the semiconductor substrate to form a buried oxide film in the semiconductor substrate, concurrently to form a thermal oxide film on a surface of the semiconductor substrate; and removing the mask and the thermal oxide film formed on the surface of the semiconductor substrate.

A method for manufacturing a partial SOI substrate according to another embodiment of the present invention comprises:

successively depositing an oxide film and a nitride film to form a mask on a predetermined region of a semiconductor substrate;

thermally oxidizing a surface of exposed region of the semiconductor substrate to form a thermal oxide film;

removing the thermal oxide film formed on the surface of the semiconductor substrate to form a recessed portion on a surface of the semiconductor substrate;

implanting oxygen ion into the semiconductor substrate;

heat-treating the semiconductor substrate to form a buried oxide film in the semiconductor substrate, concurrently to form a thermal oxide film on a surface of the semiconductor substrate; and removing the mask and the thermal oxide film formed on the surface of the semiconductor substrate.

A method for manufacturing a partial SOI substrate according to another embodiment of the present invention comprises:

successively depositing an oxide film and a nitride film on a predetermined region of a semiconductor substrate;

isotropically etching the oxide film to remove an edge portion of the oxide film and to make an end face of the oxide film into an inclined surface;

removing the nitride film;

implanting oxygen ions into the semiconductor substrate with the oxide film having inclined end face being employed as a mask;

heat-treating the semiconductor substrate to form a buried oxide film in the semiconductor substrate, concurrently to form a thermal oxide film on a surface of the semiconductor substrate; and removing the mask and the thermal oxide film formed on the surface of the semiconductor substrate.

DETAILED DESCRIPTION OF THE INVENTION

Next, the embodiments of the present invention will be explained with reference to drawings.

(First Embodiment)

Figure 1A:
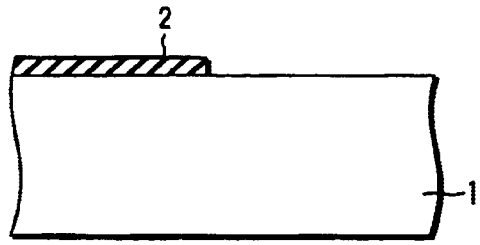
FIGS. 1A to 1C show a cross-sectional view illustrating the conventional method of manufacturing a partial SOI substrate.
Figure 2A:
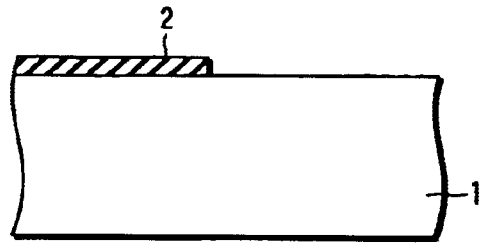
FIGS. 2A to 2C show a cross-sectional view illustrating the method of manufacturing a partial SOI substrate according to one embodiment of the present invention.
Figure 1B:
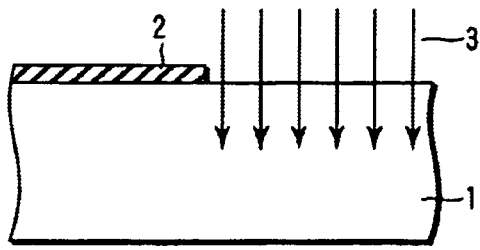
Figure 2B:
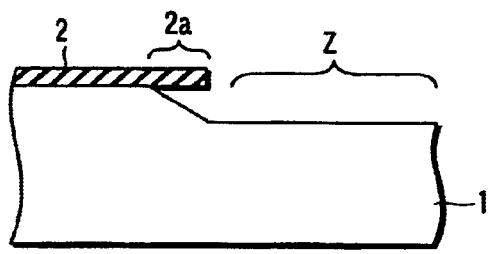

The method of manufacturing a partial SOI substrate according to this embodiment will be explained with reference to FIGS. 2A to 2C.

First of all, a silicon thermal oxide film having a thickness of about 1000 angstroms is formed on the surface of a silicon substrate 1. The thickness of the silicon thermal oxide film can be optionally selected depending on the species of oxidizing gas, oxidizing temperature, oxidizing time, etc. and may be selected from the range of 500 to 2000 angstroms. Then, part of the thermal oxide film which is located in a region where oxygen ion is implanted is removed by patterning to form a silicon thermal oxide film mask 2 as shown in FIG. 2A.

Then, the exposed region "Z" of the silicon substrate 1 is removed by isotropic etching to form a recessed portion on the surface of the silicon substrate 1. The isotropic etching can be performed, for example, by ejecting hydrochloric acid gas against the surface of the silicon substrate under the conditions of high temperatures/reduced pressures. On this occasion, since the surface of the exposed region of the silicon substrate 1 is isotropically removed, an eaves-like overhang portion 2a as shown in FIG. 2B is formed at an end portion of the thermal oxide film mask 2.

For example, when the etching is performed for 1 to 5 minutes under the conditions of: 900 to 1000° C. in temperature, 10 to 30 Torr in pressure, and 0.2 to 0.3 slm in flow rate of hydrochloric acid gas, the silicon substrate 1 can be etched to a depth of 0.1 to 0.5 $\mu$m. On this occasion, the surface of the silicon substrate 1 is etched away to such an extent that a region of the silicon substrate 1 located below the end portion of the thermal oxide film mask 2 is erased laterally inward by a distance of 0.1 to 0.5 $\mu$m.

In a subsequent step, an insulating film is buried in the region of the silicon substrate 1 where the surface thereof is exposed, thereby forming the SOI region. The region of the silicon substrate 1 which is covered with the thermal oxide film mask 2 and is not etched away becomes the non-SOI region (bulk Si region). Further, between the SOI region and the non-SOI region, there is formed a boundary region as explained hereinafter.

It is possible, through the adjustment of the depth of removing the surface of the silicon substrate 1, to offset the swelling of the substrate at the SOI region after the formation of the buried oxide film. The effect of the aforementioned offset can be obtained as long as the surface of the silicon substrate 1 is removed to a depth of 0.1 to 0.5 $\mu$m.

Figure 2C:
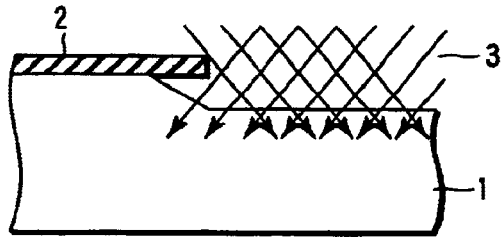

Thereafter, as shown in FIG. 2C, oxygen ions 3 are ejected against the silicon substrate 1 where a surface portion of the exposed region is etched away. The conditions of ejecting the oxygen ions 3 may be 400 to 500° C. in temperature of substrate and $1 \times 10^{17}$ to $4 \times 10^{17}$ (atoms/cm$^2$) in dosage at an accelerated voltage of 150 to 180 keV.

By obliquely ejecting the oxygen ions 3 against the major surface of the silicon substrate, the underside (boundary region) of the overhang portion 2a of the thermal oxide film mask 2 is also irradiated with the oxygen ions 3. However, the quantity of oxygen ion 3 to be implanted in this region would become smaller than that in the SOI region. The angle of ejecting the oxygen ions 3 may be about 55° to the direction orthogonal to the major surface of the substrate. Incidentally, if the angle of ejecting the oxygen ions 3 are larger than 60°, the quantity of oxygen ions 3 to be implanted in the underside (boundary region) of the overhang portion 2a of the thermal oxide film mask 2 would become insufficient. Therefore, it is desirable to control the angle of ejecting the oxygen ions 3 so as to confine it within the range of about 50° to 60° to the direction orthogonal to the major surface of the substrate.

Subsequently, the silicon substrate 1 is heat-treated to convert a region inside the substrate where the oxygen ions 3 are implanted into an oxide film. The thickness and depth of the buried oxide film can be controlled by suitably selecting the conditions of heat treatment. For example, when the heat treatment is performed in an Ar atmosphere for 4 to 10 hours at a temperature of 1300° C., the buried oxide film having a thickness of 80 nm can be formed at a depth of about 300 nm as measured from the top surface of the silicon substrate 1. Further, when the heat treatment is performed in an oxygen atmosphere, the buried oxide film having a thickness of 100 nm can be formed at a depth of about 170 nm as measured from the top surface of the silicon substrate 1.

When the heat treatment is performed in this manner, the exposed surface of the silicon substrate 1 is also oxidized, thus forming a thermal oxide film (not shown). The thermal oxide film thus formed is subsequently removed together with the thermal oxide film mask 2 by using, for example, hydrofluoric acid, thereby making it possible to form a partial SOI substrate having a buried oxide film 4 formed at a predetermined depth inside the silicon substrate 1.

Figure 3:
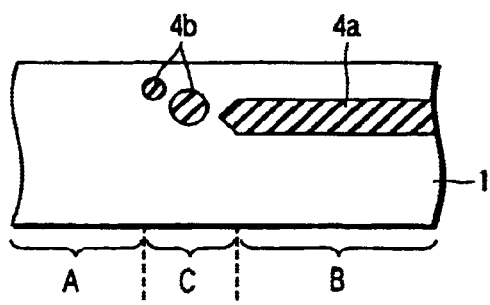
FIG. 3 is a cross-sectional view illustrating the partial SOI substrate manufactured by a method according to one embodiment of the present invention.

In the partial SOI substrate shown in FIG. 3, an oxide film (first buried oxide film) 4a having a uniform film thickness is formed in the SOI region "B" at a constant depth. Whereas in the non-SOI region "A" however, such an oxide film is not formed at all. Furthermore, in the boundary region "C" interposed between the SOI region "B" and the non-SOI region "A", an oxide film (second buried oxide film) 4b which is inclined is intermittently buried therein. Since the quantity of oxygen ions 3 being implanted is relatively small in this boundary region "C", the thickness of the second buried oxide film 4b becomes non-uniform. The depth of the second buried oxide film 4b is also caused to become shallow gradually starting from the SOI region "B" toward the non-SOI region "A". It may be said that the second buried oxide film 4b is formed with a curvature in the boundary region "C".

Figure 1C:
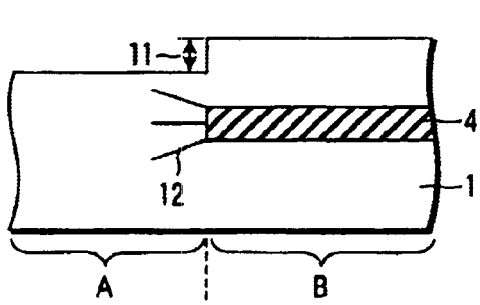

Incidentally, as shown in FIG. 1C, in the case of the conventional partial SOI substrate, the SOI region "B" having the buried oxide film 4 formed therein and the non-SOI region "A" are disposed side by side. Therefore, the conventional partial SOI substrate is accompanied with a problem that due to the expansion of the buried oxide film 4, crystal defects 12 are caused to generate in the non-SOI region "A". Whereas in the case of the partial SOI substrate according to the embodiments of the present invention, since the stress generated in the non-SOI region can be alleviated, it is possible to inhibit the crystal defects from being generated in the non-SOI region.

Figure 4:
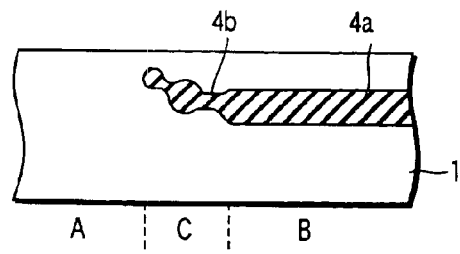
FIG. 4 is a cross-sectional view illustrating the partial SOI substrate manufactured by a method according to another embodiment of the present invention.

The configuration of the buried oxide film 4 in the boundary region "C" can be controlled by suitably selecting the implantation conditions of oxygen ions or the annealing conditions. For example, if the heat treatment time is as relatively short, as less than 5 hours, the buried oxide film 4 would become a discontinuous configuration, as shown in FIG. 3. The buried oxide film 4 having such a discontinuous configuration is advantageous in the respect that the electric potential of the body region of a transistor formed on the SOI layer can be controlled by the electric potential of the substrate. On the other hand, if the heat treatment time is as relatively long, as not less than 8 hours, the buried oxide film 4 would become a continuous configuration, as shown in FIG. 4. It is advantageous in this case in the respect that the parasitic capacitance between the semiconductor element formed on the SOI layer and the semiconductor substrate can be minimized, thereby making it possible to realize a higher speed operation of the semiconductor element. In either configurations of the buried oxide film 4, the width of the boundary region "C" should preferably be within the range of 1 to 5 μm. If the width of the boundary region "C" is less than 1 μm, it would become difficult to sufficiently derive the effects to be derived from the interposition of the boundary region "C" between the SOI region "B" and the non-SOI region "A". On the other hand, if the width of the boundary region "C" becomes larger than 5 μm, the integration density of semiconductor elements may be deteriorated. Incidentally, the width of the boundary region "C" can be controlled within a desired range by controlling the depth of removing the surface portion of silicon substrate, the angle of implanting the oxygen ion 3, etc.

Figure 5:
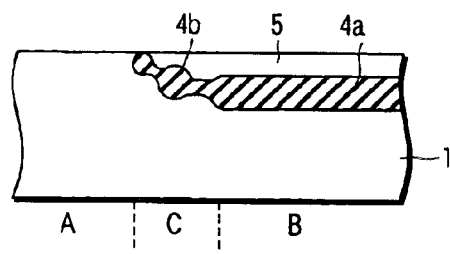
FIG. 5 is a cross-sectional view illustrating the partial SOI substrate manufactured by a method according to a further embodiment of the present invention.

Further, as shown in FIG. 5, the second buried oxide film 4b may be extended and protruded up to the surface of the silicon substrate 1 at one end portion of the boundary region "C" which is located on the non-SOI region side thereof. When the second buried oxide film 4b is constructed in this manner, the SOI layer 5 located in the SOI region "B" and in the boundary region "C" can be completely isolated from the silicon substrate 1 by the interposition of the first and second buried oxide films 4. As a result, it is now possible, on the occasion of fabricating a logic element on the SOI layer 5, to reduce the capacitive coupling of the element with the substrate, thereby making it possible to enhance the speed of operation. In this case, the logic element is enabled to operate in the same manner as the element that is fabricated on the surface of so-called SOI wafer.

On the other hand, when the partial SOI substrate is constructed as shown in FIG. 3 or FIG. 4, the SOI layer 5 is not electrically insulated from the silicon substrate 1. Therefore, a semiconductor element which is vulnerable to the substrate-floating effect such as SRAM and DRAM can be fabricated on the surface of the SOI layer 5.

As described above, depending on the semiconductor element to be fabricated on the surface of the SOI layer 5, the configuration of the buried insulating film 4 can be optionally determined, thereby making it possible to sufficiently derive the characteristics of the element to be obtained.

When an MOS transistor is formed on the non-SOI region (bulk Si region) "A" of the partial SOI substrate manufactured in this manner, the semiconductor device according to this embodiment of the present invention can be obtained.

Figure 6:
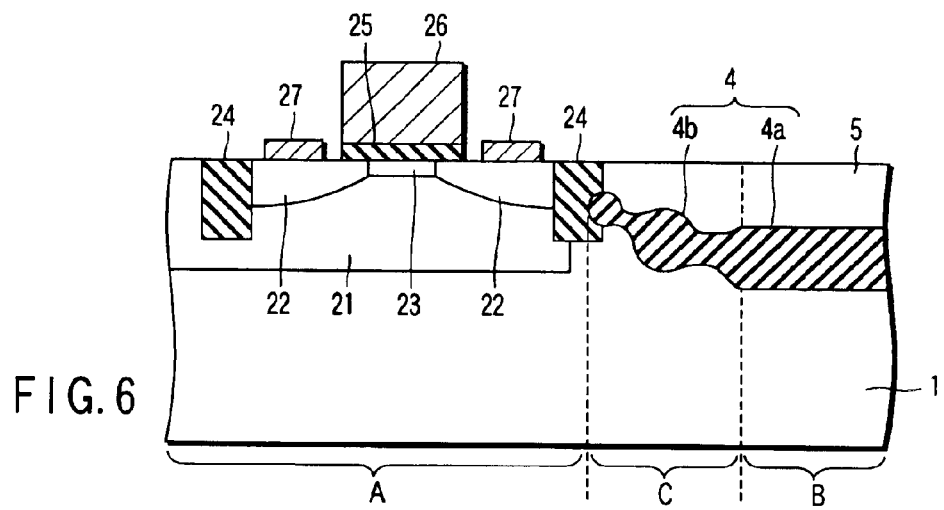
FIG. 6 is a cross-sectional view illustrating the semiconductor device according to one embodiment of the present invention.

FIG. 6 shows a cross-sectional view illustrating the semiconductor device according to one embodiment of the present invention. As shown in FIG. 6, boron was implanted as an impurity into the non-SOI region "A" of the partial SOI substrate at a concentration of $5.0 \times 10^{17}$ (atoms/cm$^3$) and to a depth of about 1.0 μm to form a p-type well 21. Further, by TEOS, a pair of element isolating insulating films 24 were formed to define the element region. A gate electrode 26 was formed through a gate insulating film 25 in this element region, and phosphorus was ion-implanted as an impurity into the element region at a concentration of $1.0 \times 10^{18}$ to $1.0 \times 10^{20}$ (atoms/cm$^3$) to form an n-type diffusion layer 22. The depth of junction of the diffusion layer 22 was set to 0.2 μm and the area of junction thereof was set to 0.1 μm².

Further, according to the conventional procedure, source/drain electrodes 27 were formed to accomplish the semiconductor device shown in FIG. 6.

Since a partial SOI substrate having a boundary region provided therein with a buried oxide film of specific configuration was employed in the semiconductor device according to this embodiment of the present invention, it was possible to minimize leak current.

The SOI substrate according to this embodiment of the present invention as shown in FIGS. 3 to 5 can be manufactured by various methods.

(Second Embodiment)

The method of manufacturing a partial SOI substrate according to this embodiment will be explained with reference to FIGS. 7A to 7D.

Figure 7A:
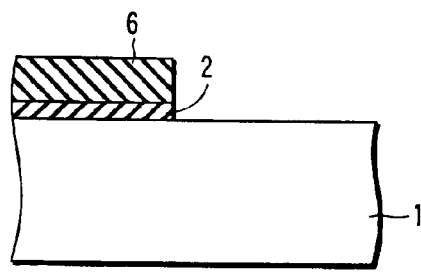
FIGS. 7A to 7D show a cross-sectional view illustrating the method of manufacturing a partial SOI substrate according to another embodiment of the present invention.

First of all, a silicon thermal oxide film 2 having a thickness of 1000 angstroms is formed on the surface of a silicon substrate 1 and a silicon nitride film 6 having a thickness of 1000 angstroms is formed on the silicon thermal oxide film 2. The thickness of the silicon nitride film 6 can be optionally selected depending on the film-forming temperature, film-forming time, etc. and may be selected from the range of 500 to 1500 angstroms. Incidentally, the thickness of the silicon thermal oxide film 2 may be selected from the range of 500 to 2000 angstroms. Then, part of the thermal oxide film/silicon nitride film which is located in a region where oxygen ions are implanted is removed by patterning to form a mask, as shown in FIG. 7A.

Figure 7C:
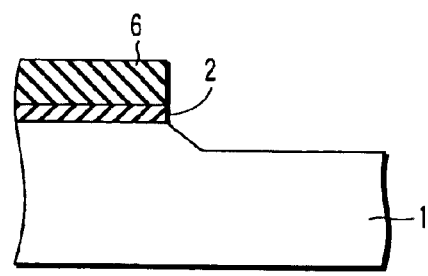
Figure 7B:
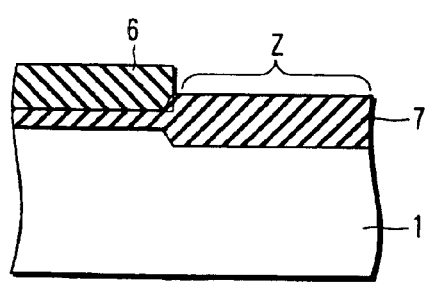

Then, by thermal oxidation treatment, a thermal oxide film 7 having a thickness of about 0.2 μm is formed in the exposed region "Z" of the silicon substrate 1 as shown in FIG. 7B. The thermal oxide film 7 formed herein is then removed to form a recessed portion on the surface of the exposed portion of the silicon substrate 1. Accordingly, it is preferable in this case to set the thermal oxidation conditions to obtain the thermal oxide film 7 having a thickness ranging from about 0.2 to 1.0 μm. If the thickness of the thermal oxide film 7 is less than 0.2 μm, it may become difficult to offset the swelling of the SOI layer after the formation of the buried oxide film. On the other hand, if the thickness of the thermal oxide film 7 exceeds 1.0 μm, it may become difficult to make the surface of the SOI region flush with the surface of the non-SOI region after the formation of the buried oxide film.

The thermal oxide film 7 formed in this manner is then removed by using, for example, hydrofluoric acid as shown in FIG. 7C. As a result, a recessed portion is formed on the surface of the exposed region of the silicon substrate 1. In this case, the surface portions of the silicon substrate 1 which are located in contact with the mask are obliquely etched away. In a subsequent step, an oxide film having a specific configuration is buried in these obliquely etched portions, thereby forming a boundary region. Incidentally, as already explained with reference to the aforementioned First Embodiment, as long as the surface of the silicon substrate 1 is removed to a depth of 0.1 to 0.5 μm, it is possible to offset the swelling of the substrate at the SOI region after the formation of the buried oxide film.

Figure 7D:
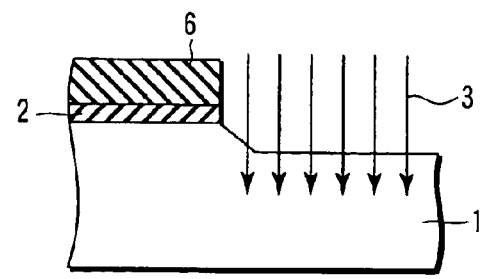

Then, as shown in FIG. 7D, oxygen ions 3 are ejected against the silicon substrate 1 where the surface portion of the exposed region has been removed. The conditions of ejecting the oxygen ions 3 may be 400 to 500° C. in temperature of substrate and $1 \times 10^{17}$ to $4 \times 10^{17}$ (atoms/cm²) in dosage at an accelerated voltage of 150 to 180 keV.

In this case, since the end faces of the thermal oxide film 2 and the silicon nitride film 6 constituting the mask are aligned with each other as shown in FIG. 7D, the oxygen ions 3 can be implanted in a direction perpendicular to the surface of the substrate 1.

Figure 8A:
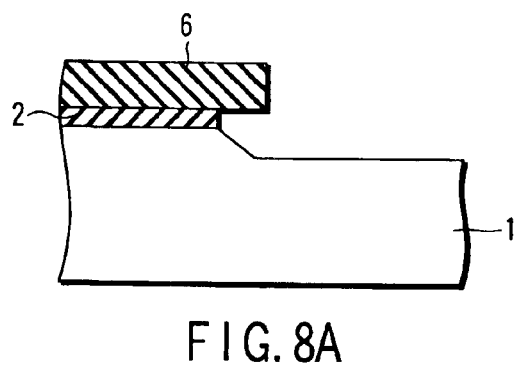
FIGS. 8A and 8B show a cross-sectional view illustrating the method of manufacturing a partial SOI substrate according to another embodiment of the present invention.
Figure 8B:
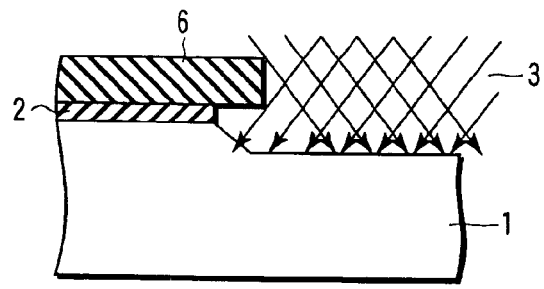

Incidentally, depending on the conditions on the occasion of forming the thermal oxide film 7 on the exposed surface of the substrate 1 or on the conditions on the occasion of removing the thermal oxide film 7, the end portion of the silicon thermal oxide film 2 may be concurrently removed, thereby forming a structure where the end portion of the silicon nitride film 6 is laterally protruded or overhung. If such is the case, it is desirable to implant the oxygen ions 3 from a direction which is inclined to the major surface of substrate 1 as shown in FIG. 8B. It is possible, in this manner, to control the quantity and depth of the oxygen ions to be implanted into the substrate 1 so as to confine them within desired ranges. Incidentally, when the oxygen ion are to be obliquely irradiated or ejected, the angle of the oxygen ions should preferably be set within the range of about 50° to 60° to the direction orthogonal to the major surface of substrate, for the same reason as already explained above.

Subsequently, the silicon substrate 1 is heat-treated under the same conditions as described above to form an oxide film at a predetermined region inside the substrate 1 where the oxygen ions have been previously implanted. In this case, the exposed surface of the silicon substrate 1 is also permitted to oxidize, thus forming a thermal oxide film. This thermal oxide film is then removed together with the mask by the same procedure as already described above, thus manufacturing the partial SOI substrate as shown in FIGS. 3 to 5.

In the partial SOI substrate that has been manufactured in this manner according to this embodiment also, the surface of the silicon substrate 1 is inclined relative to the direction of implanting the oxygen ion as far as the boundary region is concerned, so that almost the same effects as in the case of First Embodiment can be obtained. Namely, since the quantity of the oxygen ions 3 to be implanted into the boundary region is relatively small, the thickness of the second buried oxide film 4b becomes non-uniform. With respect to the depth of the implanted oxygen ions also, it becomes shallow gradually starting from the SOI region toward the non-SOI region, i.e. the buried oxide film is formed with a certain curvature. As a result, the stress generated in the non-SOI region would be alleviated, thus making it possible to suppress the generation of crystal defects generated in the non-SOI region.

(Third Embodiment)

The method of manufacturing a partial SOI substrate according to this embodiment will be explained with reference to FIGS. 9A to 9D.

Figure 9A:
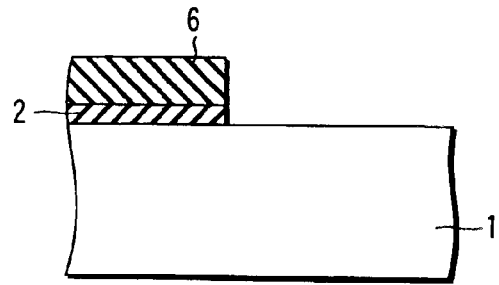
FIGS. 9A to 9D show a cross-sectional view illustrating the method of manufacturing a partial SOI substrate according to another embodiment of the present invention.
Figure 9B:
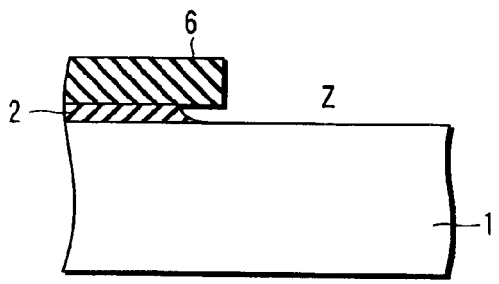

First of all, a thermal oxide film 2 having a thickness ranging from 1000 angstroms to 5000 angstroms is formed on the surface of a silicon substrate 1 and a silicon nitride film 6 having a thickness of about 1000 angstroms is formed on the thermal oxide film 2. The thickness of the silicon nitride film 6 can be optionally selected from the range as explained above. Then, part of the thermal oxide film/the silicon nitride film which is located in a region where oxygen ion is implanted is removed by patterning to form a mask as shown in FIG. 9A.

Then, the thermal oxide film 2 is isotropically etched to make the end face of the thermal oxide film 2 into an inclined surface. The isotropic etching can be performed by wet etching employing hydrofluoric acid for example. In this manner, a boundary region to be explained hereinafter is formed in a portion of the silicon substrate 1 which is located below the afore-mentioned inclined end face of the thermal oxide film 2.

After the silicon nitride film 6 is selectively etched away by using phosphoric acid, etc., oxygen ions 3 are ejected onto the silicon substrate 1 with the thermal oxide film 2 being employed as a mask. The conditions of ejecting the oxygen ions 3 may be 400 to 500° C. in temperature of substrate and $1\times10^{17}$ to $4\times10^{17}$ (atoms/cm$^2$) in dosage at an accelerated voltage of 150 to 180 keV. Since the quantity and range of implanting the oxygen ions 3 are controlled according to the configuration of the end portion of the oxide film, it is preferable in this embodiment to implant the oxygen ions 3 in a direction perpendicular to the major surface of the silicon substrate 1.

Since the thermal oxide film 2 is formed such that the film thickness thereof becomes thinner gradually toward the end portion of the thermal oxide film 2, the concentration of oxygen ions to be implanted onto the silicon substrate 1 is also caused to vary gradually.

Figure 9C:
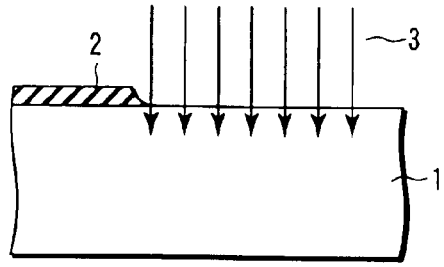
Figure 9D:
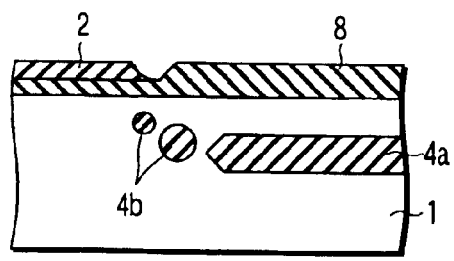

Thereafter, the silicon substrate 1 is heat-treated under the same conditions as described above to form an oxide film 4 in a predetermined region inside the substrate where the oxygen ions 3 have been previously implanted, as shown in FIG. 9D. On this occasion, the exposed surface of the silicon substrate 1 is also concurrently oxidized to form a thermal oxide film 8. This thermal oxide film 8 is subsequently removed together with the mask by the same procedure as already described above, thereby manufacturing the partial SOI substrate as shown in FIGS. 3 to 5.

In the partial SOI substrate that has been manufactured in this manner according to this embodiment also, the surface of the silicon substrate 1 is inclined relative to the direction of implanting the oxygen ions as far as the boundary region is concerned, so that almost the same effects as in the case of First Embodiment can be obtained. Namely, since the quantity of the oxygen ions 3 to be implanted into the boundary region is relatively small, the thickness of the second buried oxide film 4b becomes non-uniform. With respect to the depth of the implanted oxygen ions also, it becomes shallow gradually starting from the SOI region toward the non-SOI region, i.e. the buried oxide film is formed with a certain curvature. As a result, the stress generated in the non-SOI region would be alleviated, thus making it possible to suppress the generation of crystal defects generated in the non-SOI region.

(Fourth Embodiment)

The electric characteristics of the semiconductor device according to this embodiment of the present invention were assessed as follows.

Figure 10:
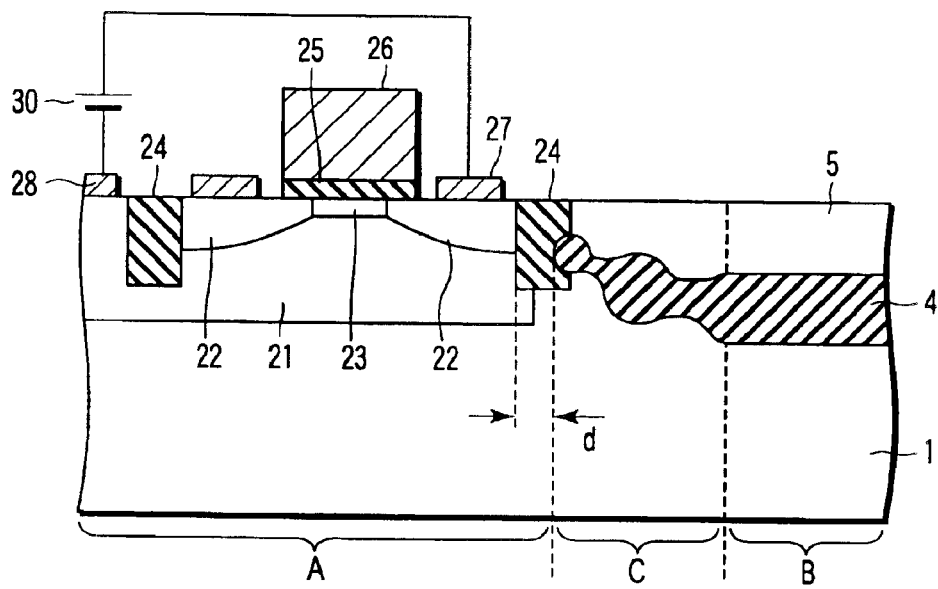
FIG. 10 is a cross-sectional view illustrating the method of evaluating the electric characteristics of the semiconductor device where a partial SOI substrate was employed.

The method of assessment of the electric characteristics of the semiconductor devices will be explained with reference to FIG. 10. First of all, by using the partial SOI substrate prepared in the aforementioned First to Third Embodiments, a semiconductor device according to the embodiment of the present invention shown in FIG. 6 was manufactured. Incidentally, the distance "d" between one end of the boundary region "C" located on the non-SOI region side thereof and the p-n junction was variously changed to 0 μm, 0.5 μm and 1 μm. Further, a well electrode 28 was formed on the substrate 1 and electrically connected via a power source 30 with source/drain electrodes 27. Then, a reverse bias of 2V to 4V was applied to the p-n junction to see if a leak current of 1 μA or more flowed, the p-n junction permitting such a degree of leak current being assumed as a defect. Based on the ratio of such defects, the junction leak current characteristics between the source/drain electrode and the well electrode were assessed. On this occasion, the depletion layer was extended respectively by about 0.25 μm to 0.4 μm.

For the purpose of comparison, by the same procedures as described above except that the conventional partial SOI substrate as shown in FIG. 1C was employed, the conventional semiconductor devices were manufactured and similarly assessed with respect to the junction leak current characteristics between the source/drain electrode and the well electrode.

Figure 11:
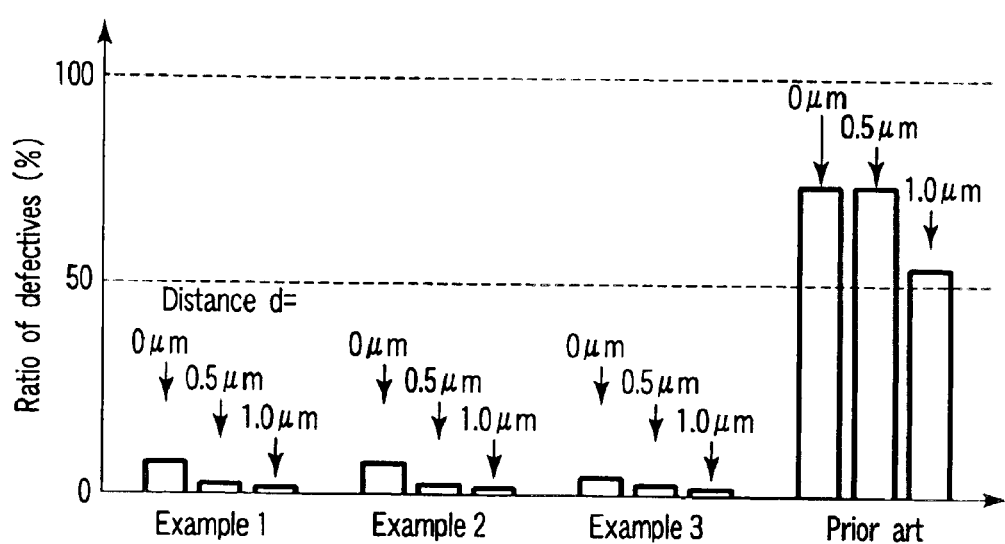
FIG. 11 is a graph illustrating the electric characteristics of the semiconductor device where a partial SOI substrate was employed.

FIG. 11 shows the junction leak current characteristics between the source/drain electrode and the well electrode. In the case of the semiconductor devices according to the embodiments of the present invention, the ratio of the defects was as small as 2 to 8%. Whereas, in the case of the conventional semiconductor devices, the ratio of the defects was as large as about 50 to 70%.

Further, it will be recognized that when the distance "d" between one end of the boundary region "C" located on the non-SOI region side thereof and the source/drain regions was increased, the junction leak current was proportionally minimized. In particular, when the distance "d" between one end of the boundary region "C" located on the non-SOI region side thereof and the source/drain regions was increased to 0.5 μm or more, the junction exhibiting the junction leak current was decreased to 2% or less.

It was confirmed from the aforementioned results that the partial SOI substrates which were manufactured according to the embodiments of the present invention were very small in crystal defects in the bulk Si (non-SOI) region.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
   a semiconductor substrate including an SOI region where a first insulating film is buried, and a non-SOI region, said semiconductor substrate being provided with a boundary region formed between said SOI region and said non-SOI region and having a second insulating film buried therein, said second insulating film being inclined upward from the SOI region side toward the non-SOI region side, said second insulating film having a thickness which is smaller than the thickness of said first insulating film and being tapered from the SOI region side to the non-SOI region side;
   a pair of element isolating insulating regions separately formed in said non-SOI region of semiconductor substrate and defining element regions;
   a pair of impurity diffusion regions formed in said element regions and in contact with said element isolating insulating regions, respectively; and
   a gate electrode formed via a gate insulating film in the element region of said semiconductor substrate.

2. The semiconductor device according to claim 1, wherein said second insulating film formed in said boundary region of said semiconductor substrate is buried as a continuous film all along the lateral direction of said boundary region.

3. The semiconductor device according to claim 1, wherein said second insulating film formed in said boundary region of said semiconductor substrate is intermittently formed in said boundary region.

4. The semiconductor device according to claim 1, wherein the width of said boundary region in said semiconductor substrate is within the range of 1 to 5 μm.

5. The semiconductor device according to claim 1, wherein the distance from one end of said boundary region located on the non-SOI region side to said impurity diffusion region is 0.5 μm or more.

6. The semiconductor device according to claim 1, wherein said semiconductor substrate is a silicon substrate.

7. The semiconductor device according to claim 1, wherein said first insulating film and said second insulating film are both formed of a silicon oxide film.

* * * * *

UNITED STATES PATENT AND TRADEMARK OFFICE
CERTIFICATE OF CORRECTION

PATENT NO. : 6,956,265 B2
DATED : October 18, 2005
INVENTOR(S) : Nagano et al.

It is certified that error appears in the above-identified patent and that said Letters Patent is hereby corrected as shown below:

Title page,
Item [57], ABSTRACT,
Line 1, change "closed" to -- disclosed --.

Signed and Sealed this

Seventeenth Day of January, 2006

JON W. DUDAS
*Director of the United States Patent and Trademark Office*